United States Patent [19]

Pecone et al.

[11] Patent Number: 5,611,057
[45] Date of Patent: Mar. 11, 1997

[54] COMPUTER SYSTEM MODULAR ADD-IN DAUGHTER CARD FOR AN ADAPTER CARD WHICH ALSO FUNCTIONS AS AN INDEPENDENT ADD-IN CARD

[75] Inventors: Victor K. Pecone, Austin; Russell C. Smith, Pflugerville; Jay R. Lory, Austin, all of Tex.

[73] Assignee: Dell USA, L.P., Austin, Tex.

[21] Appl. No.: 376,312

[22] Filed: Jan. 20, 1995

Related U.S. Application Data

[63] Continuation-in-part of Ser. No. 351,848, Dec. 8, 1994, and Ser. No. 319,207, Oct. 6, 1994.

[51] Int. Cl.⁶ .................................................. H01R 23/00
[52] U.S. Cl. ............................. 395/282; 361/784; 439/74
[58] Field of Search ................................. 361/784, 785; 439/74, 75; 395/281–282

[56] References Cited

U.S. PATENT DOCUMENTS

| | | | |
|---|---|---|---|
| 5,099,394 | 3/1992 | Hood et al. | 361/785 |
| 5,163,219 | 11/1992 | Akulow et al. | 361/785 |
| 5,308,248 | 5/1994 | Davidge et al. | 439/59 |
| 5,446,869 | 8/1995 | Padgett et al. | 395/500 |
| 5,471,590 | 11/1995 | Melo et al. | 395/288 |

Primary Examiner—Ayaz R. Sheikh
Assistant Examiner—Sumati Lefkowitz
Attorney, Agent, or Firm—Henry N. Garrana; Mark P. Kahler; Diana L. Roberts

[57] ABSTRACT

A daughter card for mounting to an adapter card, wherein the daughter card includes adapter card connectors for mounting to the adapter card and also an edge connector for insertion directly into a computer slot so that the daughter card may also function as a stand-alone card. The daughter card is both mechanically and electrically compliant as an independent PCI add-in card and includes a PCI edge connector for insertion directly into a PCI slot. This provides additional modularity since the daughter card can be purchased and configured as a separate and independent PCI adapter card as well as for mating to a host adapter card to provide extra functionality to the host adapter card. In addition, since the daughter card can be directly inserted into the PCI bus, the daughter card provides greater component access and probing for testing. Further, the daughter card can be tested independently of the host adapter card during manufacturing functional test, thus providing more reliable testing.

21 Claims, 7 Drawing Sheets

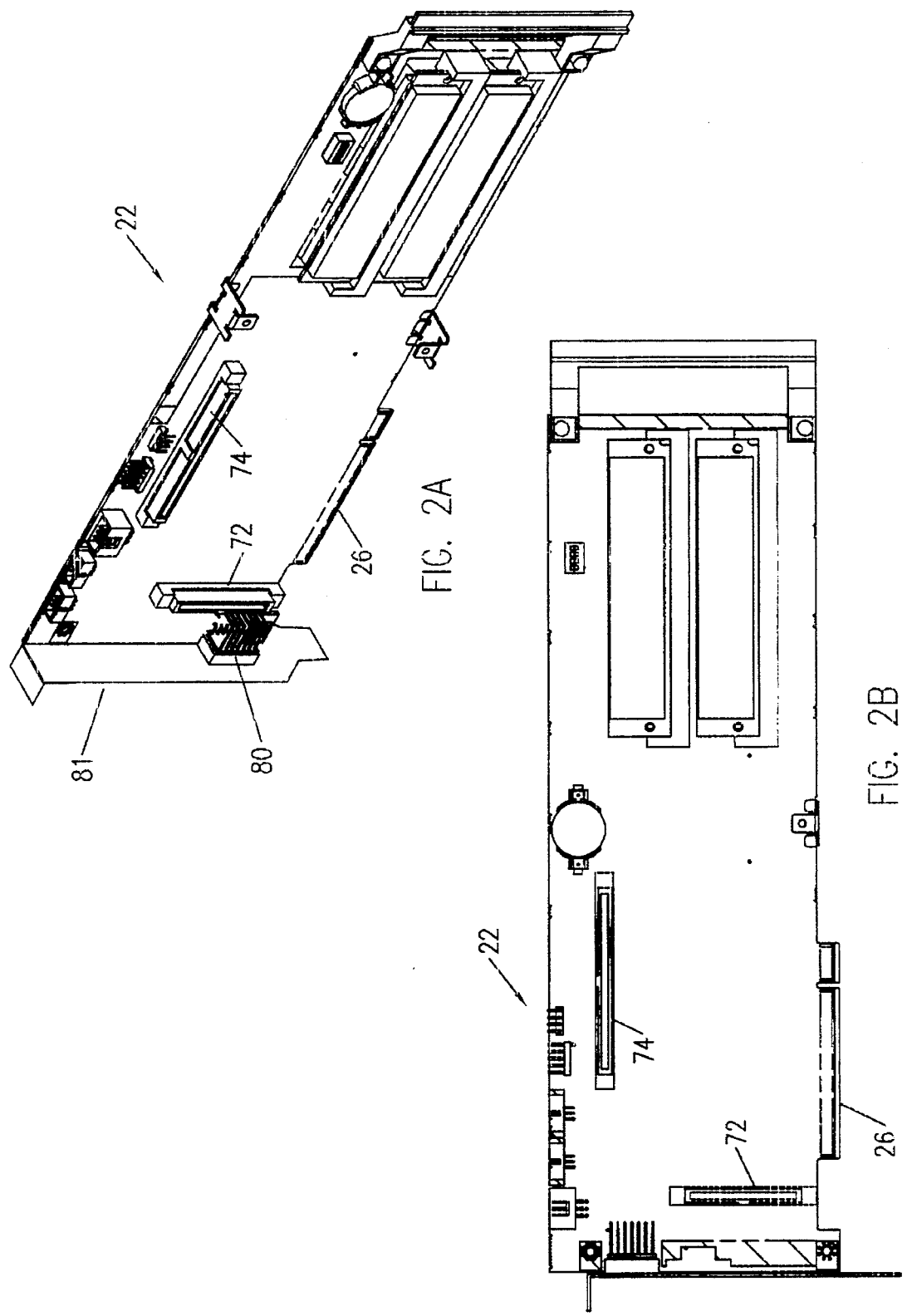

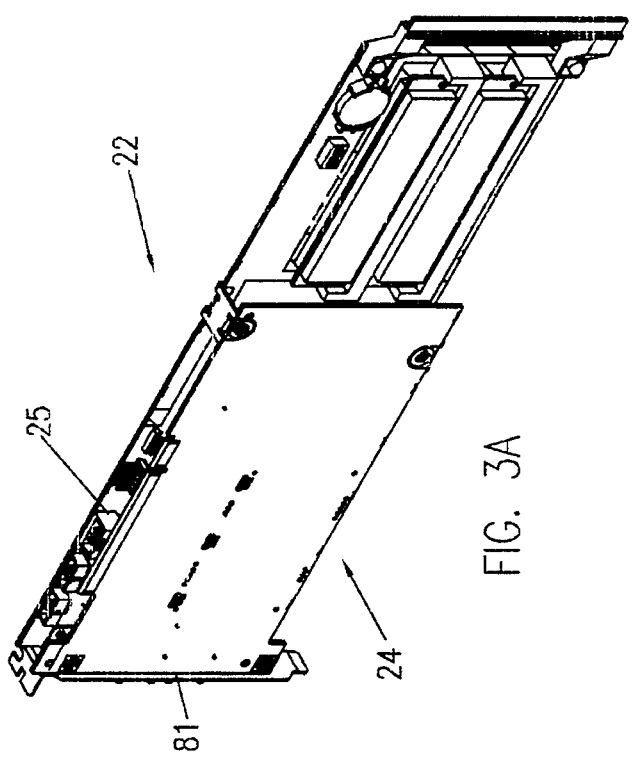
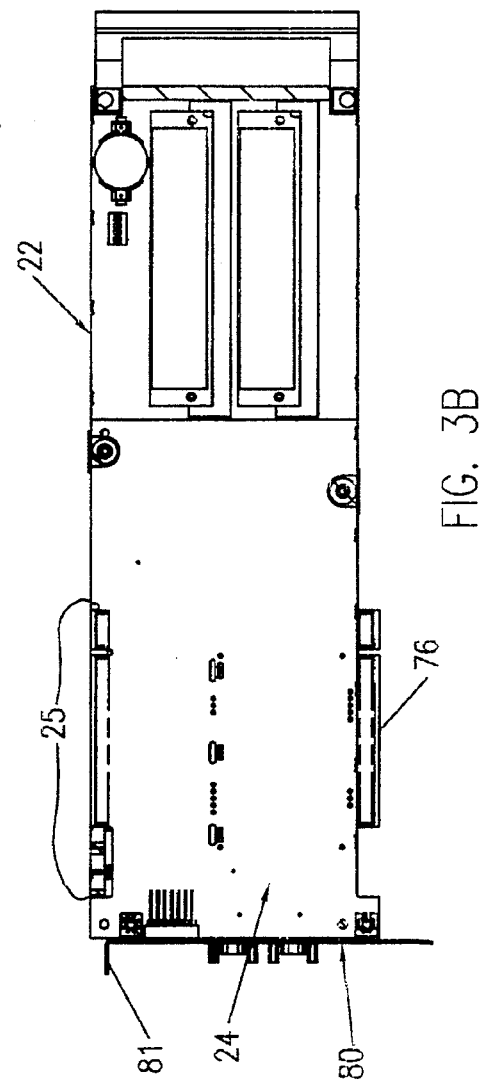

COMPUTER SYSTEM MODULAR ADD-IN DAUGHTER CARD FOR AN ADAPTER CARD WHICH ALSO FUNCTIONS AS AN INDEPENDENT ADD-IN CARD

CROSS-REFERENCES TO RELATED APPLICATIONS

This is a continuation-in-part of copending application Ser. No. 08/351,848 titled "Computer System SCSI Adapter Card Including an Add-in Daughter Board Providing an External SCSI Connector For Modular and Upgradable SCSI Bus Routing Options" and filed Dec. 8, 1994, whose inventors are Victor Pecone and Jay Lory, and which is assigned to Dell USA, L.P.

This is also a continuation-in-part of copending application Ser. No. 08/319,207 titled "PCI/PCI Bus Interface Controller with Non-coupled Peripheral Slave Bus Extension" and filed Oct. 6, 1994, whose inventors are Victor Pecone and Jay Lory, and which is assigned to Dell USA, L.P.

FIELD OF THE INVENTION

The present invention relates to an add-in daughter card for a PCI adapter card in a computer system, wherein the add-in daughter card can also function as an independent PCI-compatible add-in card.

DESCRIPTION OF THE RELATED ART

Computer architectures generally include a plurality of devices interconnected by one or more various buses. For example, modern computer systems typically include a CPU coupled through cache bridge logic to main memory. The cache bridge logic also typically couples to a high bandwidth local expansion bus, such as the the peripheral component interconnect (PCI) bus or the VESA (Video Electronics Standards Association) VL bus. The new local bus standards such as the VL bus and the PCI bus are not constrained by the requirement to be backwards compatible with prior expansion bus adapters and thus provide much higher throughput than older expansion buses. Examples of devices which can be coupled to local expansion buses include SCSI adapters, network interface cards, video adapters, etc. An older type expansion bus is generally coupled to the local expansion bus. Examples of such expansion buses included the industry standard architecture (ISA) bus, also referred to as the AT bus, the extended industry standard architecture (EISA) bus, or the microchannel architecture (MCA) bus. Various devices are typically coupled to this second expansion bus, including a fax/modem, sound card, etc.

In order to accommodate increasing requirements for data storage and data transfer capability, several peripheral device bus interface standards have been developed for data storage and transfer. These interface standards provide an interface between the host computer system and data storage devices which store data. Among these are the IDE, or integrated drive electronics interface, the ESDI, or enhanced small device interface, and the SCSI bus, or small computer systems interface bus. Modem computer systems which include a SCSI controller typically either incorporate the SCSI controller on the computer system motherboard, or provide the SCSI controller as an add-in card or adapter card to an expansion bus, such as the PCI bus, ISA bus, or EISA bus.

A primary consideration in computer component design is modularity. For example, a user may purchase a SCSI adapter card having a single SCSI controller and SCSI channel and later determine that an additional SCSI controller and channel are desired. As another example, a user may purchase a SCSI adapter card including only an internal SCSI connector and cable and later desire an external SCSI connector for connecting external devices. However, including additional SCSI controllers and/or connectors on an adapter card adds cost to the card. This extra cost is undesirable for users who do not need or do not want the extra functionality. However, those customers who desire this extra functionality may be unwilling to buy an adapter card which does not include the required functionality.

In order to provide modularity and upgradability, it is sometimes desirable to couple an adapter card to a local bus, such as the PCI bus, wherein the adapter includes a secondary PCI bus for added expansion capabilities. In this manner, additional PCI devices may be coupled to the secondary PCI bus. For example, U.S. Patent application Ser. No. 08/351,848 titled "Computer System SCSI Adapter Card Including an Add-in Daughter Board Providing an External SCSI Connector For Modular and Upgradable SCSI Bus Routing Options" discloses a SCSI adapter card which can receive an add-in daughter card. The SCSI adapter card includes a secondary or local PCI bus, and the optional add-in daughter card couples to the local PCI bus and provides additional functionality to the host adapter card. Therefore, the user can purchase an adapter card having a desired functionality and can later upgrade this functionality with the add-in daughter card.

However, one problem with an add-in daughter card to an adapter card is that it is generally very difficult to perform testing on the card. In general, the add-in daughter card must be tested while mounted on the host adapter card. This reduces component access and probing and also makes the testing dependent on the functionality of the adapter card. Therefore, an improved method for testing an add-in daughter card designed for insertion on a host adapter card is desired. In addition, it would be desirable for the add-in daughter card to provide additional modularity to provide increased expansion options for the user.

Therefore, a new modular, upgradable PCI adapter card/ daughter card architecture is desired which provides improved modularity and upgradability. It is further desirable to provide better methods for testing an add-in daughter card to an adapter card.

SUMMARY OF THE INVENTION

The present invention comprises an add-in daughter card to an adapter card, wherein the daughter card can also function as a stand-alone adapter card. When mounted to the adapter card, the daughter card is a parallel mezzanine style daughter card which provides modular and upgradable functionality to the host adapter card. According to the present invention, the daughter card also includes a bus edge connector and is mechanically and electrically compliant with a desired bus specification. Thus the daughter card can be inserted directly into a computer expansion slot as an independent add-in card. This provides additional modularity since the daughter card can be configured as a separate and independent adapter card as well as a daughter card to the host adapter card. The ability to connect the daughter card to a desired bus also facilitates testing of the card.

In the preferred embodiment, the daughter card includes a PCI edge connector for insertion into a PCI bus and also includes adapter card connectors for coupling to the host adapter card. The daughter card is preferably a SCSI card which provides one or more SCSI channels as an add-in card or which provides additional functionality to a SCSI host adapter card. The SCSI host adapter card preferably includes a secondary or local PCI bus, and when the daughter card is mounted to the adapter card, the adapter card connectors on the daughter card couple to the secondary PCI bus. Therefore, the daughter card is both mechanically and electrically compliant as an independent PCI add-in card and includes a PCI edge connector for insertion directly into a PCI slot. This provides additional modularity since the daughter card can be purchased and configured as a separate and independent PCI adapter card as well as for mating to a host adapter card to provide extra functionality to the host adapter card. In addition, since the daughter card can be directly inserted into the PCI bus, the daughter card provides greater component access and probing for testing. Further, the daughter card can be tested independently of the host adapter card during manufacturing functional test, thus providing more reliable testing.

BRIEF DESCRIPTION OF THE DRAWINGS

A better understanding of the present invention can be obtained when the following detailed description of the preferred embodiment is considered in conjunction with the following drawings, in which:

FIGS. 2A and 2B illustrate perspective and side views, respectively, of an adapter card including connections for the daughter card of FIG. 1;

FIGS. 3A and 3B illustrate perspective and side views, respectively, of the adapter card with accompanying daughter card mounted to the adapter card;

DETAILED DESCRIPTION OF THE PREFERRED EMBODIMENT

Daughter Card

Figure 1A:
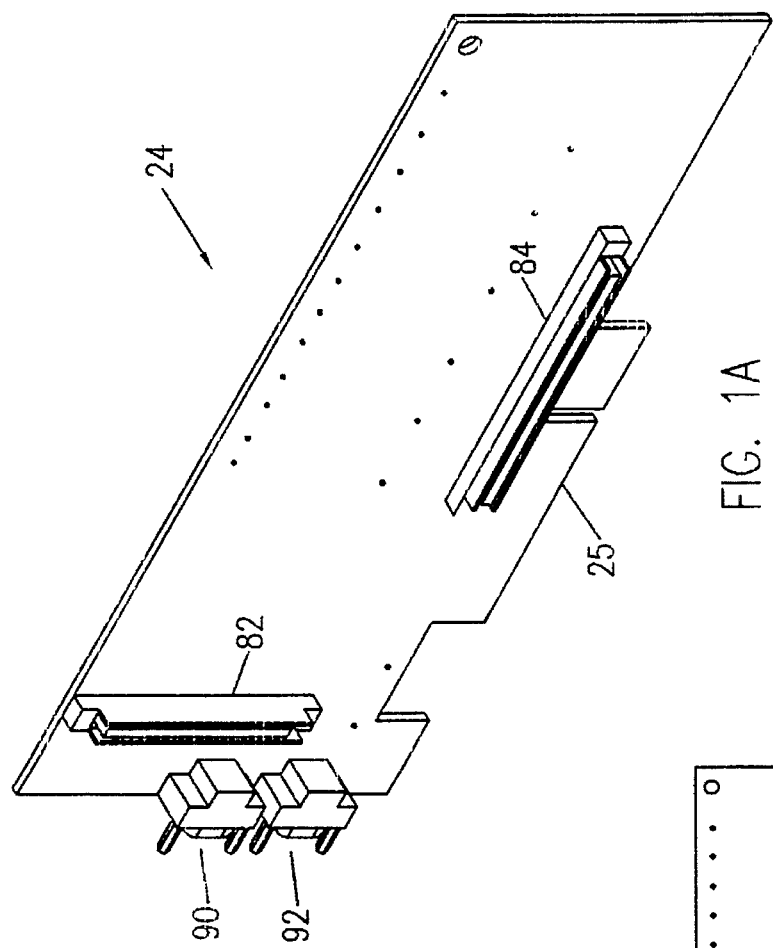
FIGS. 1A and 1B illustrate perspective and side views, respectively, of the add-in daughter card according to the present invention.
Figure 1B:
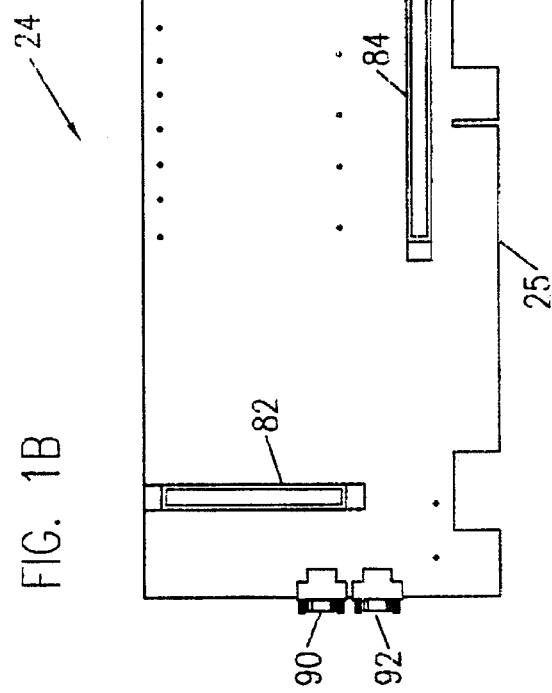

Referring now to FIGS. 1A and 1B, perspective and side views of the add-in daughter card 24 according to the preferred embodiment of the invention are shown. As shown, the daughter card 24 includes corresponding adapter card connectors 82 and 84 for connecting to an adapter card (22 FIGS. 2A and 2B). The daughter card 24 also includes an edge connector 25 for coupling to a bus. In the preferred embodiment, the edge connector 25 of the daughter card 24 is a PCI (Peripheral Component Interconnect) connector, i.e., a PCI compliant gold finger edge connector which can be inserted directly into a PCI bus slot for coupling to a PCI bus. However, it is noted the daughter card 24 may be adapted for other buses, such as the VESA VL bus, the AT bus, the EISA bus, or the MCA bus, among others. In addition, the adapter card connectors 82 and 84 are preferably for coupling to a PCI bus. However, the connectors 82 and 84 may be adapted for coupling to other buses, as desired.

The daughter card 24 is mechanically and electrically compliant with the PCI bus. In other words, the form factor of the daughter card 24 is fully compliant with the PCI 2.0/2.1 mechanical specifications, and the edge connector 25 is fully compliant with the PCI electrical specification. Thus the daughter card 24 may be mounted directly on a host adapter card 22 as shown in FIGS. 3A and 3B, or the daughter card 24 may be inserted directly into a PCI slot as a stand-alone adapter card.

When the daughter card 24 is used as a stand-alone card, the daughter card plugs directly into a PCI connector slot of a PCI-based host computer system. In this embodiment the daughter card 24 may include a standard mechanical I/O bracket, as desired, and the daughter card components and external I/O connectors meet full PCI mechanical compliance. In this embodiment, the adapter card connectors 82 and 84 are not used.

When the daughter card 24 is connected to the adapter card 22, as shown in FIGS. 3A and 3B, the combined card, referred to herein as an expansion device, preferably includes one external bracket 81 and one externally accessile component 80 and also occupies only one computer expansion slot. In the embodiment of FIGS. 1–3, the external bracket 81 and externally accessile component 80 are provided by the adapter card 22, and the daughter card 24 includes ports 90 and 92 but does not include an external connector and bracket. In an alternate embodiment, the daughter card 24 provides the external connector and bracket, as desired. Alternatively, no external bracket and connector are provided by the combined adapter card and daughter card. For more information on the daughter card 24 used to provide an external connector to an adapter card, please see U.S. patent application Ser. No. 08/351,848 titled "Computer System SCSI Adapter Card Including an Add-in Daughter Board Providing an External SCSI Connector For Modular and Upgradable SCSI Bus Routing Options" and filed Dec. 8, 1994, whose inventors are Victor Pecone and Jay Lory, which is hereby incorporated by reference in its entirety.

In the preferred embodiment, the daughter card 24 is a small computer systems interface (SCSI) card which functions either as a stand-alone SCSI add-in card or as a daughter card to provide additional functionality, such as one or more additional SCSI channels and connectors, to a host SCSI adapter card. In an alternate embodiment, the daughter card 24 is a network interface card that functions as a stand-alone network adapter card or as a daughter card to provide additional functionality to a host network adapter card.

Although not explicitly shown in FIGS. 1A and 1B, various elements comprised on the daughter card 24 are interconnected to perform various SCSI operations, as is well known in the art. For example, the SCSI daughter card 24 preferably includes one or more SCSI controllers and corresponding SCSI connectors as well as associated termination logic. The daughter card 24 also may include SIMM sockets which receive corresponding memory modules, a processor or CPU which performs operations necessary to implement one or more RAID configurations as well as for controlling operations of the daughter card 24, a PCI interface chip, a plurality of LEDs for displaying the status of the card and optionally a bracket including an external SCSI connector. Thus the daughter card 24 comprises a fully functional PCI SCSI card and also functions as a daughter card to host SCSI adapter card 22.

Adapter Card

Referring now to FIGS. 2A and 2B, perspective and side views of the adapter card 22 are shown. In the preferred embodiment, the adapter card 22 is a PCI card and includes a standard PCI edge connector 26 for coupling to a PCI bus. However, it is noted that the adapter card 22 may integrated into the motherboard of the computer system. In addition, the adapter card 22 may be adapted for other buses, such as the VESA VL bus, the AT bus, the EISA bus, or the MCA bus, among others. The adapter card 22 preferably includes a secondary PCI bus, and when the daughter card 24 is mounted to the adapter card 22 the daughter card 24 connects to this secondary PCI bus.

As noted above, the daughter card 24 may be a small computer systems interface (SCSI) adapter card, a network interface card or other type of card. In the preferred embodiment, the daughter card 24 and adapter card 22 are SCSI cards. In this embodiment, the adapter card 22 provides one or more internal or external SCSI channels, and the daughter card 24 preferably provides one or more additional SCSI controllers and channels and/or an external SCSI connector. In an alternate embodiment, the daughter card 24 and adapter card 22 are network interface cards, and the daughter card 24 provides additional network ports to the adapter card 22, as desired.

Although not explicitly shown in FIGS. 2A and 2B, various elements comprised on the adapter card 22 are interconnected to perform various SCSI operations, as is well known in the art. For example, the SCSI adapter card 22 preferably includes a SCSI controller and a corresponding SCSI connector, associated termination logic, SIMM sockets which receive corresponding memory modules, and a processor or CPU which performs operations necessary to implement one or more RAID configurations as well as for controlling operations of the adapter card 22. The adapter card 22 also preferably includes a PCI interface chip, a plurality of LEDs for displaying the status of the card and an bracket 81 including an external SCSI connector 80. Thus the adapter card 22 comprises a fully functional PCI SCSI card.

The SCSI adapter card 22 includes two daughter card connectors 72 and 74 for receiving the optional add-in daughter card 24. In one embodiment, signal lines from the SCSI controller(s) on the adapter card 22 connect to pins on the daughter card connectors 72 and 74 to provide signals to the daughter card 24 when the daughter card 24 is mounted to the adapter card 22. In this embodiment, the CPU on the adapter card 22 preferably stores one or more bits indicating whether the daughter card 24 is connected as well as bits indicating whether SCSI controllers are included on the daughter card 24, whether internal SCSI channels are routed eternally, and whether SCSI devices are connected to the daughter card 24. For more information on the SCSI adapter 22 of the preferred embodiment, please see related copending application Ser. No. 08/351,848 referenced above.

Daughter Card Mounted to Adapter Card

Referring now to FIGS. 3A and 3B, perspective and side views of the daughter card 24 according to the preferred embodiment of the invention mounted to the adapter card 22 is shown. When the daughter card 24 is connected to the adapter card 22, signals are provided between the daughter card connectors 72 and 74 on the adapter card 22 and the adapter card connectors 82 and 84 on the daughter card 24.

As shown in FIGS. 3A and 3B, when the daughter card 24 is used as an upgrade card and is mounted to the adapter card 22, the daughter card 24 mounts to the adapter card 22 such that the daughter card components face the components of the adapter card 22. This enables the combined adapter card 22 and daughter card 24 to maintain single slot height requirements for the PCI bus. In this configuration, a custom mechanical I/O bracket is required either on the adapter card 22 or the daughter card 24. Also, in this embodiment the daughter card edge connector 25 is not used.

As noted above, the components of the adapter card 22 and daughter card 24 are positioned on facing sides of the combined expansion device when the daughter card 24 is mounted to the adapter card 22. This presents problems in testing the components on the daughter card 24 since there is limited access to these components for probing. However, according to the present invention, the daughter card 24 is placed directly in a PCI slot for testing, and the components are readily available for probing. In addition, the daughter card 24 is tested independently of the adapter card 22, which provides more reliable testing of the daughter card 24.

In one embodiment the daughter card 24 provides a different SCSI interface than the adapter card 22 to provide scalability among interfaces. For example, in one embodiment the adapter card 22 provides one or more parallel SCSI channels or ports, and the daughter card 24 provides one or more serial SCSI channels or ports 90 and 92, or vice versa.

Computer System Incorporating Adapter Card and Daughter Card

Figure 4:
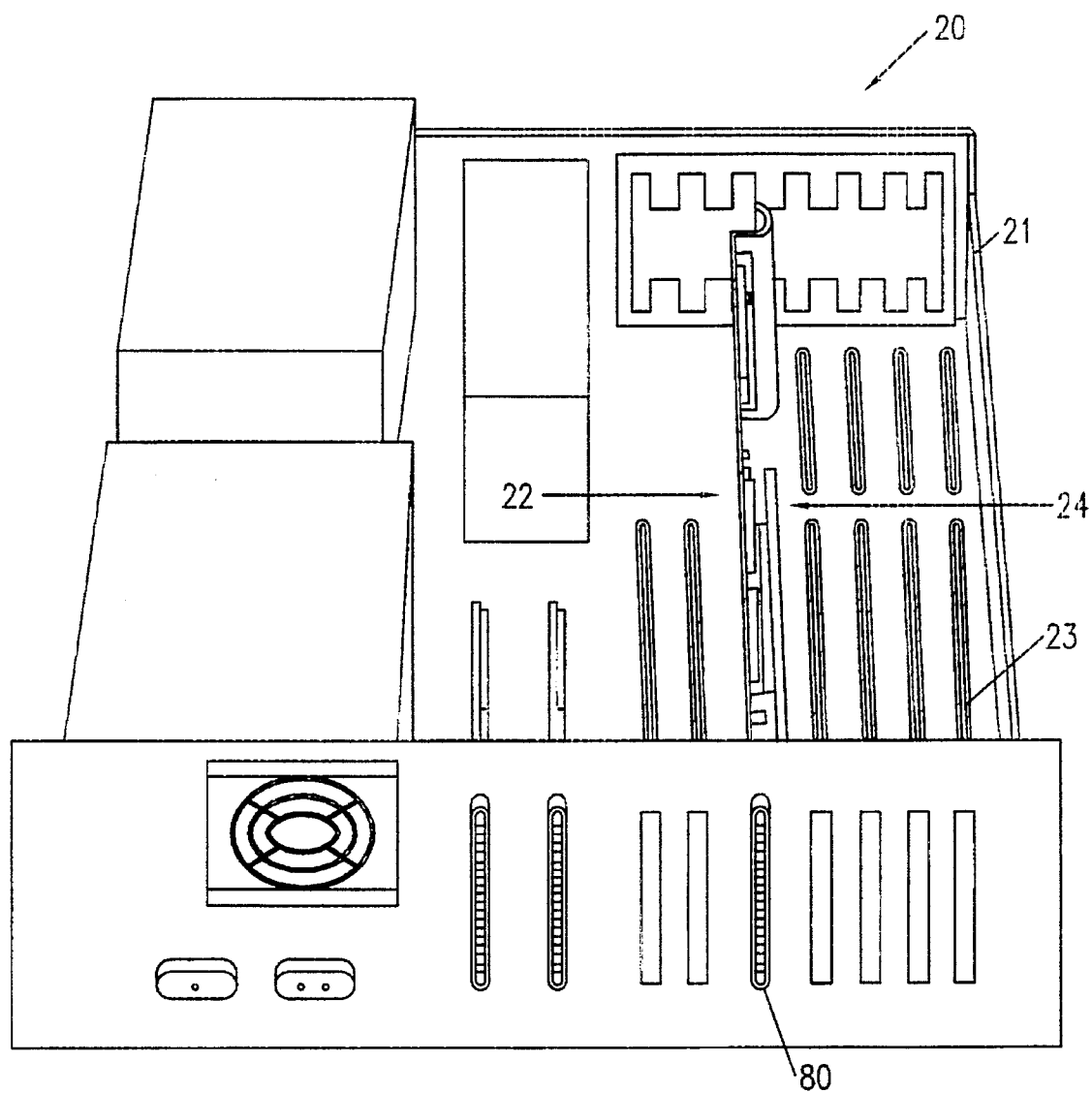
FIG. 4 illustrates a computer system incorporating the adapter card wherein the daughter card is mounted to the adapter card.

Referring now to FIG. 4, a computer system 20 incorporating the SCSI adapter 22 with accompanying daughter card 24 according to the preferred embodiment of the invention is shown. The computer system 20 comprises a system unit 21 which includes various standard components, including a CPU, memory, and expansion bus including expansion slots 23. The computer system 20 also preferably includes one or more SCSI devices comprised within the system unit 21, such as a hard drive, CD-ROM, tape drive, etc. As shown, the SCSI adapter 22 and daughter card 24 occupy only one expansion slot 23 in the computer system 20, preferably a PCI slot. Either the adapter card 22 or the daughter card 24 provides the external SCSI connector 80, as desired. When the daughter card 24 is used alone without the adapter card 22, the daughter card 24 occupies one expansion slot 23 in the system and functions as a stand-alone SCSI card.

The daughter card 24 preferably includes one or more SCSI controllers, as desired, for various SCSI channel routing options. When present, the SCSI controllers on the daughter card 24 each provide additional SCSI channels in the system. In the preferred embodiment, the daughter card 24 includes one or more SCSI controllers and corresponding channels or ports and can function either as a stand alone card to provide internal or external SCSI channels in the computer system, or the daughter card 24 mounts to the adapter card 22 as shown in FIGS. 3A and 3B to provide additional functionality, such as additional SCSI controllers and channels, to the adapter card 22. Thus the daughter card 24 serves as either an upgrade for the user or a stand-alone adapter.

Computer System Diagram

Figure 5:
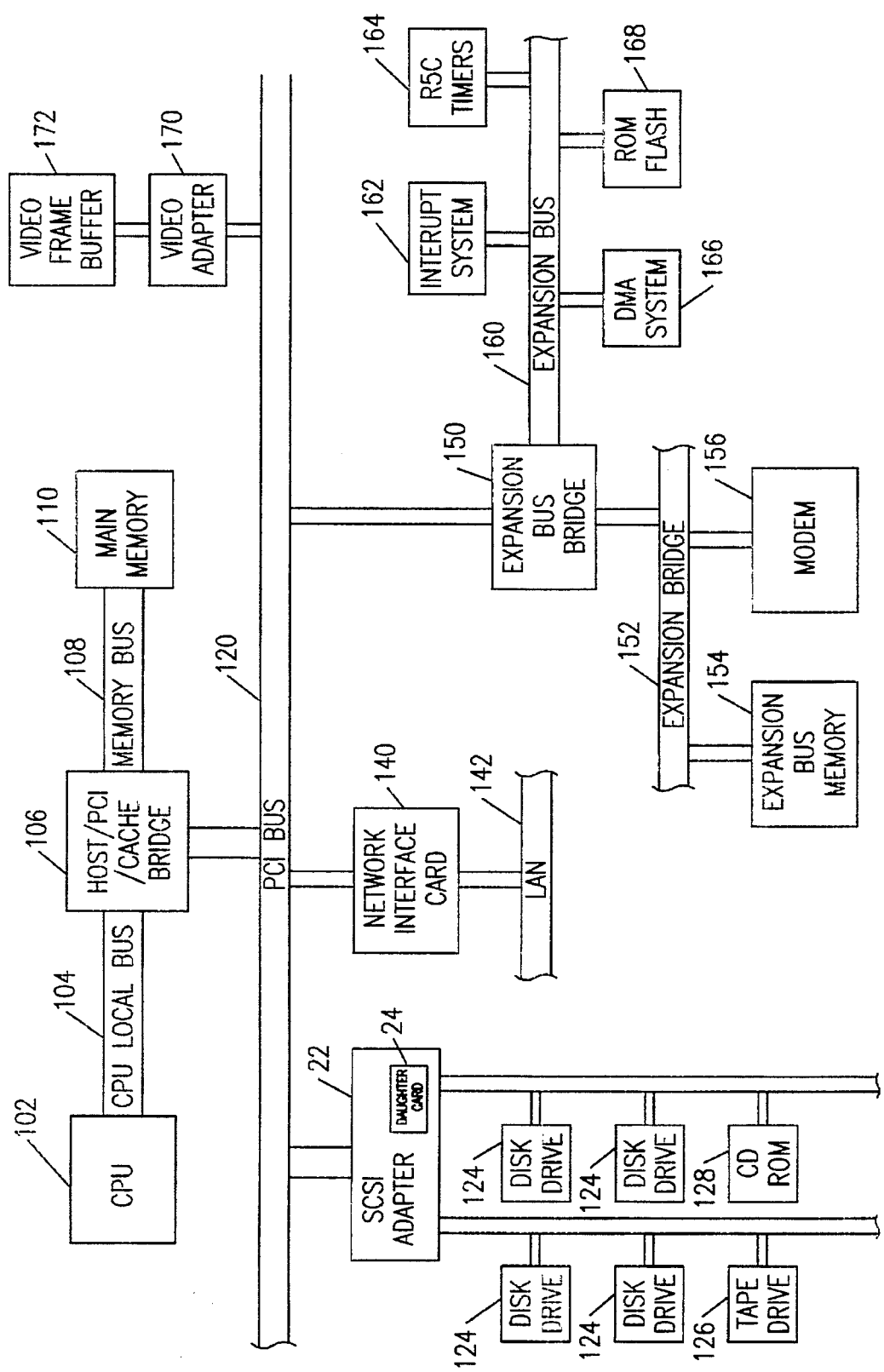
FIG. 5 is a block diagram of a computer system incorporating a PCI SCSI adapter and daughter card according to one embodiment of the present invention.

Referring now to FIG. 5, a block diagram of a computer system incorporating a SCSI adapter according to the preferred embodiment of the present invention is shown. It is noted that the present invention may be used in any of various types of computer systems having various architectures. As shown, the computer system includes a central processing unit (CPU) 102 which is coupled through a CPU local bus 104 to a host/PCI/cache bridge 106. The bridge 106 couples through a memory bus 108 to main memory 110. The host/PCI/cache bridge 106 also interfaces to a peripheral component interconnect (PCI) bus 120. In the preferred embodiment, a PCI local bus is used. However, it is noted that other local buses may be used, such as the VESA (Video Electronics Standards Association) VL bus.

Various types of devices may be connected to the PCI bus 120. In the embodiment shown in FIG. 5, a video adapter 170 and video frame buffer 172 are coupled to the PCI bus 120 for controlling video functions. The SCSI (small computer systems interface) adapter 22 is shown coupled to the PCI bus 120. As mentioned above, the SCSI adapter 22 includes PCI to PCI interface logic and a local PCI bus. As discussed above, SCSI adapter 22 is configured either on the motherboard or as an add-in adapter card and includes connectors for receiving the optional add-in daughter card 24 of the present invention. When inserted, the daughter card 24 connects to the local PCI bus on the SCSI adapter 22 and provides additional functionality to the adapter card 22.

In the embodiment shown in FIG. 5, the daughter card 24 is mounted to the SCSI adapter 22 as shown in FIGS. 3 and 4, and the combined card or expansion device provides two SCSI channels 123 and 125. In one embodiment the adapter card 22 provides one SCSI channel 123 and the daughter card 24 provides the other SCSI channel 125. Alternatively, the adapter card 22 provides both SCSI channels 123 and 125, and the daughter card 24 provides an external connector. Various other configurations are possible, as desired. Also, the daughter card 24 may be directly connected to the PCI bus 120, in the computer system as desired.

Each of the SCSI channels 123 and 125 may have various devices connected to them. In the embodiment shown in FIG. 5, the SCSI channel 123 includes two disk drive units 124 and a tape drive 126. The SCSI channel 125 includes two disk drive units 124 and a CD-ROM 128. It is noted that other devices may be connected to the SCSI channels 123 and 125, as desired. Various other devices may be connected to the PCI bus 120, such as a network interface card 140. As shown, the network interface card 140 interfaces to a local area network (LAN) 142.

Expansion bus bridge logic 150 is also preferably coupled to the PCI bus 120. The expansion bus bridge logic 150 interfaces to an expansion bus 152. The expansion bus may be any of varying types, including the industry standard architecture (ISA) bus, also referred to as the AT bus, the extended industry standard architecture (EISA) bus, or the microchannel architecture (MCA) bus. Various devices may be coupled to the expansion bus 152, including expansion bus memory 154 and a modem 156. The expansion bus bridge logic 150 also couples to a peripheral expansion bus referred to as the X-bus 160. The X-bus 160 is used for connecting various peripherals to the computer system. As shown, an interrupt system 162, a real time clock (RTC) and timers 164, a direct memory access (DMA) system 166, and ROM/Flash memory 168 are coupled to the X-bus 160. Other peripherals (not shown) are preferably connected to the X-bus 160, including communications ports, diagnostics ports, command/status registers, non-volatile static random access memory (NVSRAM), etc.

SCSI Adapter Architecture

Figure 6:
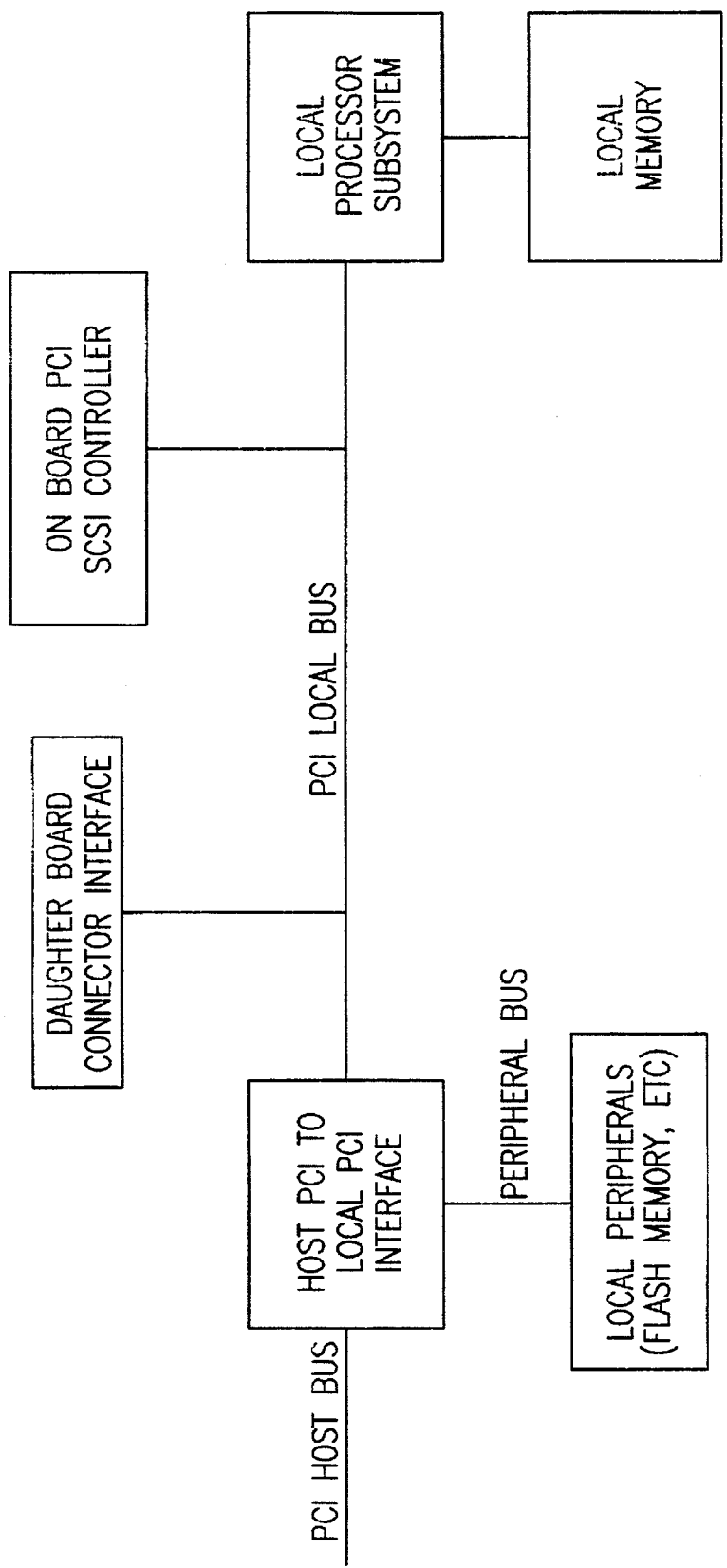
FIG. 6 is a block diagram illustrating the architecture of the SCSI adapter of FIG. 5.

Referring now to FIG. 6, a block diagram illustrating the architecture of the SCSI adapter of FIG. 5 is shown. As shown, the SCSI adapter 22 includes a Host PCI to Local PCI interface 182 for the coupling to the host PCI bus 120 and also for coupling to PCI Local Bus 184. The Host PCI to Local PCI Interface 182 acts as a PCI controller while also translating signals from the host PCI bus 120 to the local PCI bus 184. Various local peripherals 194 such as Flash memory, ROM, timers, a real time clock (RTC), etc. are coupled to the Host PCI to Local PCI Interface 182. A Local Processor Subsystem 186 is coupled to the Local PCI bus 184, and local memory 196 is coupled to the local processor subsystem 186. One or more on board PCI SCSI controllers 190 are coupled to the local PCI bus 184. In addition, a daughter card connector interface 188 is coupled to the local PCI bus 184 for interfacing to the add-in daughter card 24. The daughter card connector interface 188 includes the daughter card connectors 72 and 74.

SCSI Adapter Block Diagram

Figure 7:
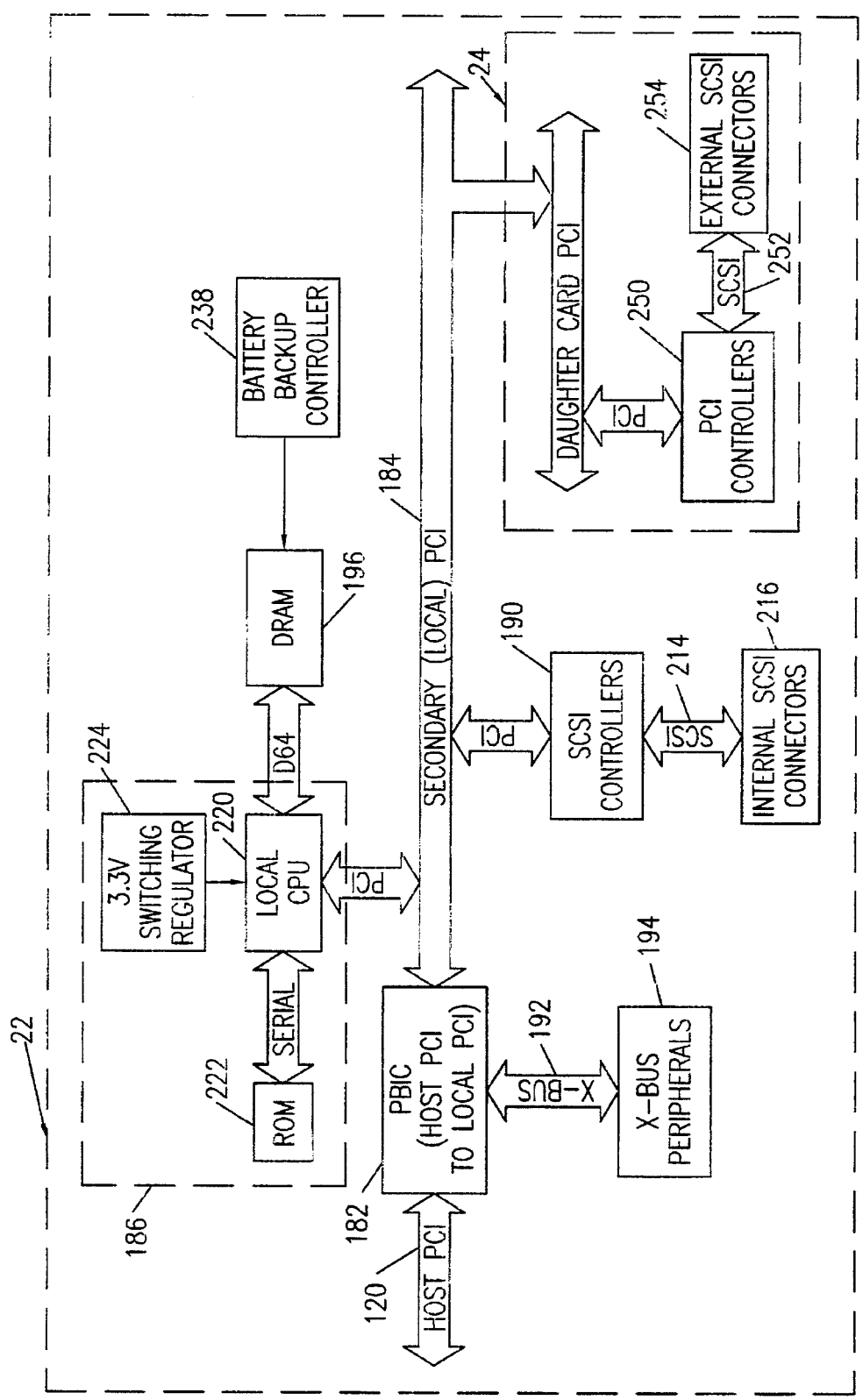
FIG. 7 is a more detailed block diagram of the SCSI adapter and daughter card of FIG. 5.

Referring now to FIG. 7, a block diagram illustrating the SCSI adapter 22 in FIG. 5 is shown. As shown, the SCSI adapter 22 includes a PCI bus interface chip (PBIC) 182, which couples to the host or primary PCI bus 120 and which comprises the PCI to PCI interface logic. The PBIC 182 interfaces through the peripheral bus or X-bus 192 to various X-bus peripherals 194 as shown. It is noted that the X-bus 192 in the SCSI adapter 22 is different from the X-bus 160 in FIG. 5. The various X-bus peripherals 194 preferably include a DMA system, interrupt system, timers, a real time clock (RTC). configuration ports, diagnostic ports, command/status registers, ROM/Flash memory, and non-volatile SRAM (NVSRAM) (all not shown).

The PBIC 182 also couples to the secondary or local PCI bus 184. As shown, the secondary PCI bus 184 is different than the primary PCI bus 120. The secondary PCI bus 184 is referred to as either the secondary PCI bus or the local PCI bus, and the primary PCI bus 120 is referred to as either the primary PCI bus or the host PCI bus. It is noted that the term "local PCI bus" used to describe the bus 184 should not be confused with the fact that the PCI bus itself can be classified as a local bus.

SCSI controllers 190 are coupled to the secondary PCI bus 184. The SCSI controllers 190 in turn couple through a SCSI bus 214 to internal SCSI connectors 216. The internal SCSI connectors 216 are for attaching the various devices, such as the disk drives 124, tape drive 126, and CD ROM 128, as shown in FIG. 1.

The local processor subsystem 186 is coupled to the secondary PCI bus 184. The local processor subsystem 186 comprises a local CPU 220, SROM 222 coupled to the local CPU 220, amd a 3.3 V switching regulator 224 coupled to the local CPU 220, as shown. The local CPU 220 includes a 64 bit data path which couples through a 64-bit data bus to the local memory 196, preferably dynamic random access memory (DRAM). A battery backup controller 238 is coupled to the local memory 196. In one embodiment, the 64-bit data bus includes connections for coupling to an optional dynamic random access memory (DRAM) upgrade daughter card and an optional second level or L2 cache system (both not shown).

The local PCI bus 184 also includes a daughter card option for receiving the daughter card 24 for additional SCSI connections and functionality. As described above, the daughter card 24 may be mounted to the adapter card 22 and also includes an edge connector 25 for insertion directly into a bus as a stand-alone card. As shown in FIG. 7, the daughter card 24 includes additional PCI controllers 250 which couple to the local PCI bus 184. The PCI controllers 250 couple to SCSI connectors 254 to provide one or more additional SCSI channels, as shown.

SCSI Adapter Card/Daughter Card Embodiments

The daughter card 24 may be configured according to various embodiments. In a first embodiment, the daughter card 24 includes one or more SCSI controllers and provides corresponding one or more SCSI channels. When the daughter card 24 is mounted to the adapter card 22, the SCSI channels provided by the daughter card 24 are in addition to those provided by the adapter card 22. In a second embodiment the daughter card 24 includes an external connector and one or more SCSI controllers. In this embodiment, the daughter card 24 can serve to reroute zero or more internal SCSI channels from the adapter card 22 to the external connector as well as providing additional SCSI channels.

In an embodiment where the daughter card 24 is either configured to provide two SCSI channels on a single external connector or reroute two internal SCSI channels from the adapter card 22 to an external connector on the daughter card 24, the SCSI signals for both channels are provided through switching logic (not shown) on the daughter card 24 to the external connector. A special Y cable (also not shown) is used to multiplex the two SCSI channels on the one SCSI-3 compliant connector 80. For more information on the use of the switching logic and Y cable to incorporate two SCSI channels on a single standard SCSI-3 connector, please see related copending application Ser. No. 08/352,254 titled "SCSI Connector and Y Cable Configuration Which Selectively Provides Single or Dual SCSI Channels on a Single Standard Connector," filed Dec. 8, 1994, which is hereby incorporated by reference as though fully set forth herein.

When the daughter card 24 is mounted to the adapter card 22, the daughter card 24 preferably provides signals to the CPU 60 on the adapter card 22 indicating that the daughter card 24 is connected, how many SCSI controllers and corresponding SCSI channels are provided by the daughter card 24, and whether any respective internal SCSI channels are rerouted externally. The daughter card 24 also indicates whether a SCSI cable and accompanying devices are connected to ports on the daughter card 24.

Therefore, the present invention provides various SCSI bus routing and expansion options. For more information on these various options, including more specific embodiments and implementation details, please see related copending application Ser. No. 08/351,848 titled "Computer System SCSI Adapter Card Including an Add-in Daughter Board Providing an External SCSI Connector For Modular and Upgradable SCSI Bus Routing Options" and filed Dec. 8, 1994, whose inventors are Victor Pecone and Jay Lory, referenced previously, which is hereby incorporated by reference in its entirety.

Conclusion

Therefore, the present invention comprises a daughter card for an adapter card which can also function as a stand-alone card. The daughter card is both mechanically and electrically compliant as an independent PCI add-in card and includes a PCI edge connector for insertion directly into a PCI slot. This provides additional modularity since the daughter card can be purchased and configured as a separate and independent PCI adapter card as well as for mating to a host adapter card to provide extra functionality to the host adapter card. In addition, since the daughter card can be directly inserted into the PCI bus, the daughter card provides greater component access and probing for testing. Further, the daughter card can be tested independently of the host adapter card during manufacturing functional test, thus providing more reliable testing.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A daughter card for use in a computer system, the daughter card comprising:

one or more controllers providing signals for performing functions in the computer system;

one or more adapter card connectors for coupling to an adapter card when the daughter card is mounted to an adapter card, wherein the daughter card provides additional functionality to the adapter card when the daughter card is mounted to the adapter card; and an edge connector for insertion in a connector slot of a computer system when the daughter card is used as a stand-alone card, wherein said edge connector complies with a bus specification;

wherein the daughter card is mountable to an adapter card and wherein the daughter card can also function as a stand-alone card to provide modular and upgradable expansion options.

2. The daughter card of claim 1, wherein said edge connector is a Peripheral Component Interconnect (PCI) edge connector adapted for insertion in a PCI slot of a computer system.

3. The daughter card of claim 2, wherein said daughter card complies with Peripheral Component Interconnect (PCI) mechanical specifications.

4. The daughter card of claim 1, wherein said daughter card is inserted directly into an expansion slot of a computer system during testing of said daughter card.

5. The daughter card of claim 1, wherein said daughter card is adapted for connecting to said adapter card in a parallel mezzanine fashion.

6. The daughter card of claim 1, further comprising:

one or more connectors coupled to said one or more controllers, wherein said one or more connectors are each adapted for coupling to one or more devices in the computer system.

7. The daughter card of claim 6, wherein said one or more controllers comprised on said daughter card are small computer systems interface (SCSI) controllers for providing one or more SCSI channels;

wherein said one or more connectors coupled to said one or more controllers comprise SCSI connectors for coupling to one or more SCSI devices in the computer system.

8. The daughter card of claim 6, wherein said one or more controllers comprised on said daughter card are network interface controllers;

wherein said one or more connectors coupled to said one or more controllers comprise network interface ports.

9. A daughter card for use in a computer system comprising:

one or more SCSI controllers providing signals for one or more SCSI channels;

one or more SCSI connectors coupled to said one or more SCSI controllers, wherein said one or more SCSI connectors are each adapted for coupling to one or more SCSI devices in the computer system;

one or more adapter card connectors for coupling to a SCSI adapter card, wherein when said daughter card is mounted to said SCSI adapter card said daughter card provides additional functionality to said SCSI adapter card;

an edge connector for insertion in a bus connector slot of a computer system when the daughter card is used as a stand-alone card; and wherein said daughter card is mountable to a SCSI adapter card and wherein said daughter card can also function as a stand-alone card to provide modular and upgradable expansion options.

10. The daughter card of claim 9, wherein said daughter card includes an external SCSI connector which is adapted to be externally accessible from the computer system when said daughter card is connected to said SCSI adapter card and said SCSI adapter card is inserted into an expansion slot of the computer system;

wherein said external SCSI connector is also adapted to be externally accessible from the computer system when said daughter card edge connector is inserted directly into a bus connector slot of a computer system;

wherein said external SCSI connector is adapted for coupling to one or more external SCSI devices.

11. The daughter card of claim 9, wherein said edge connector is a Peripheral Component Interconnect (PCI) edge connector adapted for insertion in a PCI slot of a computer system.

12. The daughter card of claim 11, wherein said daughter card complies with Peripheral Component Interconnect (PCI) mechanical specifications.

13. The daughter card of claim 9, wherein said daughter card is inserted directly into an expansion slot of a computer system during testing of said daughter card.

14. The daughter card of claim 9, wherein said daughter card is adapted for connecting to said SCSI adapter card in a parallel mezzanine fashion.

15. A computer system comprising:

a system unit;

a bus comprised within said system unit including one or more expansion slots for receiving adapter cards;

a daughter card comprised within said system unit and including an edge connector adapted for coupling to an expansion slot on said bus, wherein said daughter card includes one or more adapter card connectors for connecting to an adapter card, wherein said daughter card is mountable to an adapter card, and wherein said daughter card can also function as a stand-alone card in the computer system.

16. The computer system of claim 15, wherein said daughter card edge connector is inserted into one of said one or more expansion slots of said bus whereby said daughter card is directly coupled to said bus;

wherein said daughter card functions as a stand-alone adapter card in said computer system.

17. The computer system of claim 15, further comprising:

an adapter card comprised within said system unit and coupled to an expansion slot on said bus, wherein said adapter card includes one or more controllers providing signals for one or more bus channels, wherein said adapter card also includes one or more daughter card connectors for receiving a daughter card;

wherein said daughter card is coupled to said one or more daughter card connectors on said adapter card and provides additional functionality to said adapter card.

18. The computer system of claim 17, wherein said daughter card is removably coupled to said one or more daughter card connectors on said adapter card.

19. The computer system of claim 15, wherein said bus is a Peripheral Component Interconnect (PCI) bus and said one or more expansion slots comprise PCI bus expansion slots;

wherein said edge connector is a Peripheral Component Interconnect (PCI) edge connector adapted for insertion in one of said PCI bus expansion slots in said computer system.

20. The computer system of claim 19, wherein said daughter card complies with Peripheral Component Interconnect (PCI) mechanical specifications.

21. The computer system of claim 15, wherein said daughter card is inserted directly into one of said one or more expansion slots of said computer system during testing of said daughter card.

* * * * *